United States Patent
Gologanu et al.

(10) Patent No.: US 7,719,164 B2
(45) Date of Patent: May 18, 2010

(54) PATTERNED DIELECTRIC ELASTOMER ACTUATOR AND METHOD OF FABRICATING THE SAME

(75) Inventors: Mihai Gologanu, Bucharest (RO); Viorel Avramescu, Bucharest (RO); Stefan Dan Costea, Bucharest (RO); Li Wang, Shanghai (CN)

(73) Assignee: Honeywell International Inc., Morristown, NJ (US)

( * ) Notice: Subject to any disclaimer, the term of this patent is extended or adjusted under 35 U.S.C. 154(b) by 112 days.

(21) Appl. No.: 12/187,124

(22) Filed: Aug. 6, 2008

(65) Prior Publication Data

US 2010/0033054 A1    Feb. 11, 2010

(51) Int. Cl.
*H02N 1/00*    (2006.01)
(52) U.S. Cl. ..................... 310/309; 29/592.1
(58) Field of Classification Search ................. 310/309, 310/800; 29/592, 592.1
See application file for complete search history.

(56) References Cited

U.S. PATENT DOCUMENTS

| | | | |
|---|---|---|---|
| 6,545,384 B1 | 4/2003 | Pelrine et al. ............... | 310/309 |
| 6,583,533 B2 | 6/2003 | Pelrine et al. ............... | 310/309 |
| 6,689,288 B2 | 2/2004 | St. Clair et al. ......... | 252/62.9 R |
| 6,707,236 B2 | 3/2004 | Pelrine et al. ............... | 310/800 |
| 6,809,462 B2 | 10/2004 | Pelrine et al. ............... | 310/800 |
| 7,063,671 B2 | 6/2006 | Couvillon, Jr. .............. | 600/562 |
| 7,064,472 B2 | 6/2006 | Pelrine et al. ............... | 310/324 |
| 7,211,937 B2 | 5/2007 | Kornbluh et al. ............ | 310/800 |
| 7,224,106 B2 | 5/2007 | Pei et al. ..................... | 310/800 |
| 7,259,503 B2 | 8/2007 | Pei et al. ..................... | 310/363 |
| 2005/0067919 A1* | 3/2005 | Horning ..................... | 310/309 |
| 2008/0211342 A1* | 9/2008 | Despesse .................... | 310/309 |
| 2009/0153936 A1* | 6/2009 | Desai ....................... | 359/223.1 |

FOREIGN PATENT DOCUMENTS

JP       3-205565  *  9/1991  ............... 29/592.1
WO   WO 2005/123841 A1   12/2005

* cited by examiner

*Primary Examiner*—Thomas M Dougherty
(74) *Attorney, Agent, or Firm*—Kermit D. Lopez; Luis M. Ortiz; Kris T. Fredrick

(57) ABSTRACT

A patterned dielectric elastomer actuator is disclosed which includes a series of thin parallel elastomer filaments, separated by certain distances sandwiched between a pair of rigid electrodes. The elastomer filaments and air acts as a patterned dielectric layer. The elastomer filaments can compress laterally from a circular cross-section to an elliptical shape when a voltage is applied between the rigid electrodes. The elastomer filaments can touch laterally, which implies no further squeezing in order to provide a minimal secure distance between the rigid electrodes. The dielectric elastomer actuator can be fabricated utilizing a reel-to-reel fabrication process with the thin elastomer filaments fabricated ahead of time, by extrusion techniques and cured completely before storing on reels.

17 Claims, 3 Drawing Sheets

PATTERNED DIELECTRIC ELASTOMER ACTUATOR AND METHOD OF FABRICATING THE SAME

TECHNICAL FIELD

Embodiments are generally related to electro active polymers (EAP). Embodiments are also related to dielectric elastomer based actuators, sensors and generators. Embodiments are additionally related to the fabrication of dielectric elastomer actuators.

BACKGROUND OF INVENTION

Dielectric elastomer actuators generally include a layer of electro active polymer (EAP) sandwiched between a pair of compliant electrodes. The compliant electrodes can be designed to be able to comply with the deformations of the elastomer. A voltage difference can be applied between the compliant electrodes, which induces compression in thickness, and stretching in area of the polymer film. The electrodes in the dielectric elastomer actuators expand in area in addition to coming closer together as the polymer film thickness decreases. As the elastomer layer deforms at almost constant volume, the layer stretches in the perpendicular directions, requiring compliant electrodes. Such designs may be utilized for sensing or for converting mechanical energy into electrical energy.

A majority of prior dielectric elastomer actuator designs utilize a uniform dielectric elastomer with compliant electrodes. The voltage difference applied on the compliant electrodes squeeze the elastomer layer and produces an actuation mechanism. The uniform dielectric elastomer deforms due to an applied electrostatic force and stretches in perpendicular directions. Such uniform dielectric elastomer exhibits a very low elastic stiffness and high dielectric constants. Hence, in order to increase the actuation force, very thin layers of elastomer are required. Similarly, the fabrication of such thin layers by molding or by deposition on a substrate and their subsequent stripping from the substrate is difficult. Also, the fabrication of actual design is incompatible with reel-to-reel high volume fabrication methods due to long curing times. Often several hours are required for the elastomer layer.

Based on the foregoing it is believed that a need exists for an improved patterned dielectric elastomer based actuator, sensor and generator with rigid electrodes as described in greater detail herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is therefore one aspect of the present invention to provide for an improved dielectric elastomer actuator with rigid electrodes.

It is further aspect of the present invention to provide for an improved patterned dielectric elastomer based actuator, sensor and generator with parallel elastomer filaments.

The aforementioned aspects and other objectives and advantages can now be achieved as described herein. A patterned dielectric elastomer actuator is disclosed which includes a series of thin parallel elastomer filaments, separated by certain distances sandwiched between a pair of rigid electrodes. The elastomer filaments and air acts as a patterned dielectric layer. The elastomer filaments can compress laterally from a circular cross-section to an elliptical shape when a voltage is applied between the rigid electrodes. The elastomer filaments can touch laterally, which implies no further squeezing in order to provide a minimal secure distance between the rigid electrodes. The dielectric elastomer actuator can be fabricated utilizing a reel-to-reel fabrication process with the thin elastomer filaments fabricated ahead of time, by extrusion techniques and cured completely before storing on reels.

The pair of rigid electrodes comprises a thin aluminum foil and/or a metallized kapton film. A thin layer of fast-curing glue can be applied on a reel of thin aluminum foil and the series of elastomer filaments can be placed in parallel at controlled distances one from the other. A second thin aluminum foil with thin glue layer can be placed on top of the elastomer filaments. The elastomer filaments can be cut into longitudinal strips of desired widths by utilizing laser beam in order to obtain a multilayer stack. The long strips can be either cut transversally and attached to form a stacked device, or folded in order obtain a multilayer-stacked device. Electrical contacts can also be added to the aluminum foils, and the entire stack can be sealed in a compliant silicon rubber enclosure. The voltage difference can be applied on the electrical contacts and the entire stack compresses and can be utilized as an actuator. The dielectric elastomer is very soft at large gaps when electrostatic forces are weak, but very stiff at small gaps when electrostatic forces are strong and lead to snap-in or electric breakdown.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
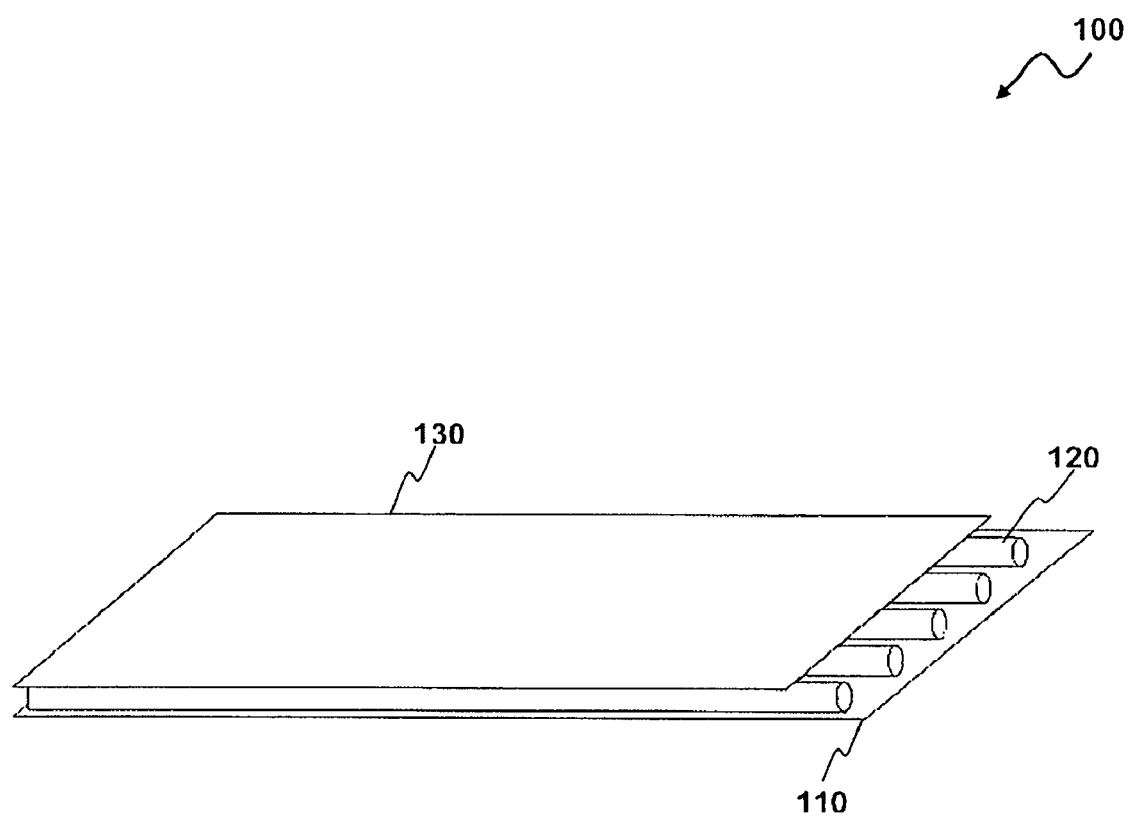
FIG. 1 illustrates a perspective view of a patterned dielectric elastomer actuator, in accordance with a preferred embodiment.

The particular values and configurations discussed in these non-limiting examples can be varied and are cited merely to illustrate at least one embodiment and are not intended to limit the scope thereof. Note that in FIGS. 1-4 identical or similar parts are indicated by identical reference numerals.

FIG. 1 illustrates a perspective view of a patterned dielectric elastomer actuator 100, in accordance with a preferred embodiment. The patterned dielectric elastomer actuator 100 generally includes a series of thin parallel elastomer filaments 120, separated by certain distances sandwiched between a pair of rigid electrodes 110 and 130. The top electrode 130 and the bottom electrode 110 can be configured from a material such as a thin layer of aluminum foil and/or a metallized kapton film. The elastomer filaments 120 or the electroactive polymer filaments 120 comprises a film of a single polymer, copolymer, or composite capable of converting electrical energy to mechanical energy and vice versa. The polymeric material of the electroactive polymer filaments 120 can be further pre-stretched or tailored to produce anisotropic mechanical properties, improve the electrical breakdown properties of the layer to enhance the transduction capability of the electroactive polymer. Pre-stretching may be performed utilizing a number of techniques known to those skilled in the art.

The elastomer filaments 120 and air acts as a patterned dielectric layer. The elastomer filaments 120 can be placed in parallel at controlled distances one from the other, as shown in FIG. 1. Note that the elastomer actuator 100, as utilized herein, is presented for general illustrative purposes only. It can be appreciated, however, that such embodiments can be implemented to convert between electrical energy and mechanical energy bi-directionally. Similarly, any of the exemplary electrodes described herein may be utilized with a generator of the present invention. Typically, a generator includes a polymer arranged in a manner, which causes a change in electric field in response to deflection of a portion of the polymer.

The elastomer filaments 120 compress with a change in electric field provided by the top electrode 130 and the bottom electrode 110. The deflection of the transducer 100 in response to a change in electric field provided by the electrodes 110 and 130 is referred to as actuation. As the elastomer filaments 120 changes in size, the deflection may be utilized to produce mechanical work. The materials utilized for the elastomer filaments 120 in accordance with the present invention are commercially available polymers. The commercially available polymers may include, for example, any commercially available silicone elastomer, polyurethane, PVDF copolymer and adhesive elastomer.

Figure 2:
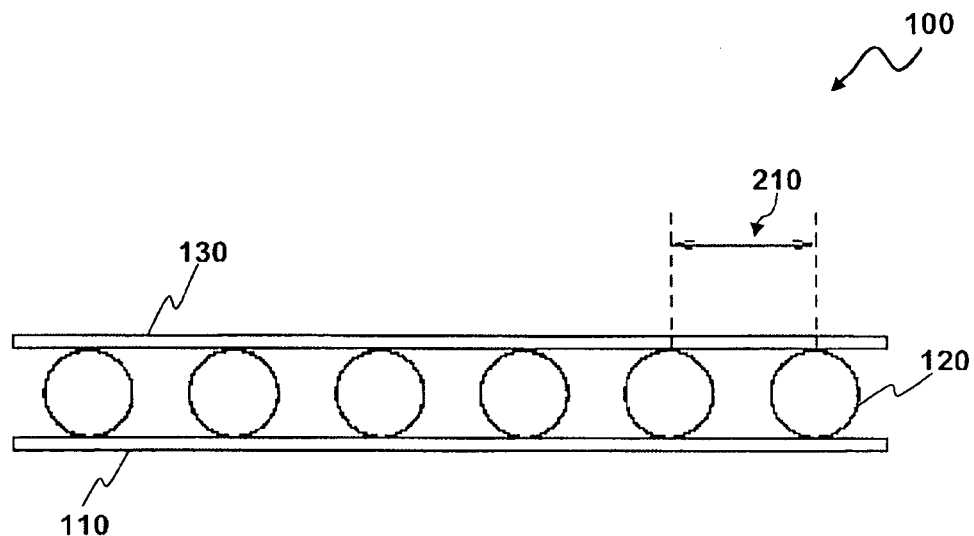
FIG. 2 illustrates a side view of the patterned dielectric elastomer actuator, in accordance with a preferred embodiment.

FIG. 2 illustrates a side view of the patterned dielectric elastomer actuator 100, in accordance with the preferred embodiment. The elastomer filaments 120 can be placed with an initial spacing 210 in order to provide a free lateral expansion for the elastomer filaments 120.

Figure 3:
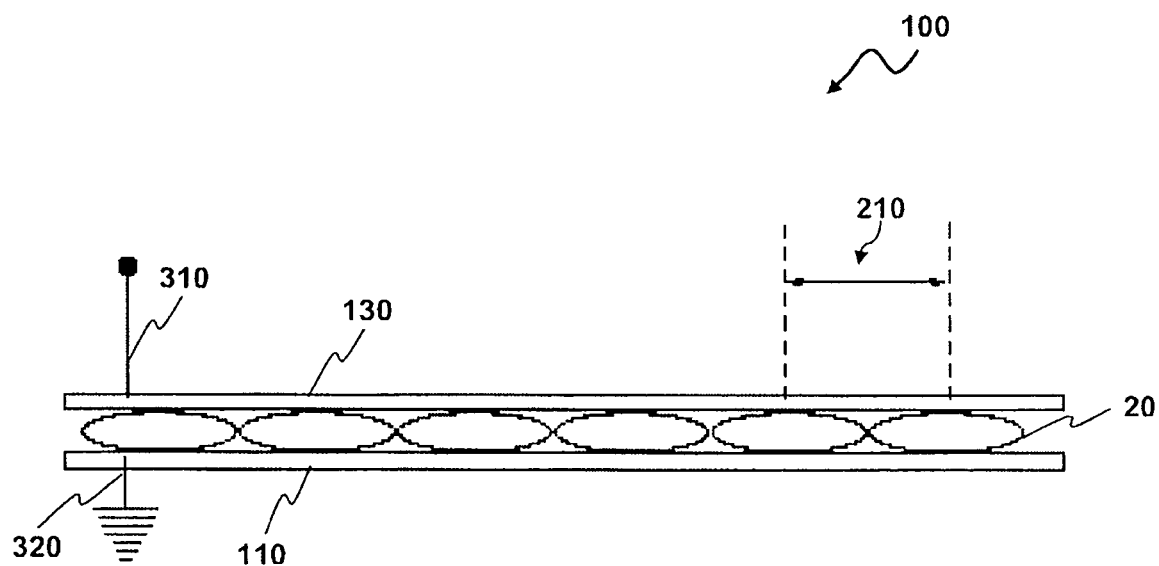
FIG. 3 illustrates a schematic view of the patterned dielectric elastomer actuator after compression, in accordance with a preferred embodiment.

FIG. 3 illustrates a schematic view of the patterned dielectric elastomer actuator 100 after compression, in accordance with a preferred embodiment. The electrodes 130 and 110 can be connected to a positive electrical connector 310 and a negative electrical connector 320, which in turn is connected to a power supply or sensory feedback circuit (not shown). The elastomer filaments 120 and air acts as a patterned dielectric layer. A voltage V can be applied between the electrodes 110 and 130 and the elastomer filaments 120 compress laterally from a circular cross-section to an elliptical shape. The rigid electrodes 110 and 130 can easily compress the elastomer filaments 120 from a circular cross-section to an elliptical shape. The elastomer filaments 120 can be squeezed and easily deformed because of the free lateral expansion and the neighboring elastomer filaments 120 eventually touch each other as depicted in FIG. 3.

Figure 4:
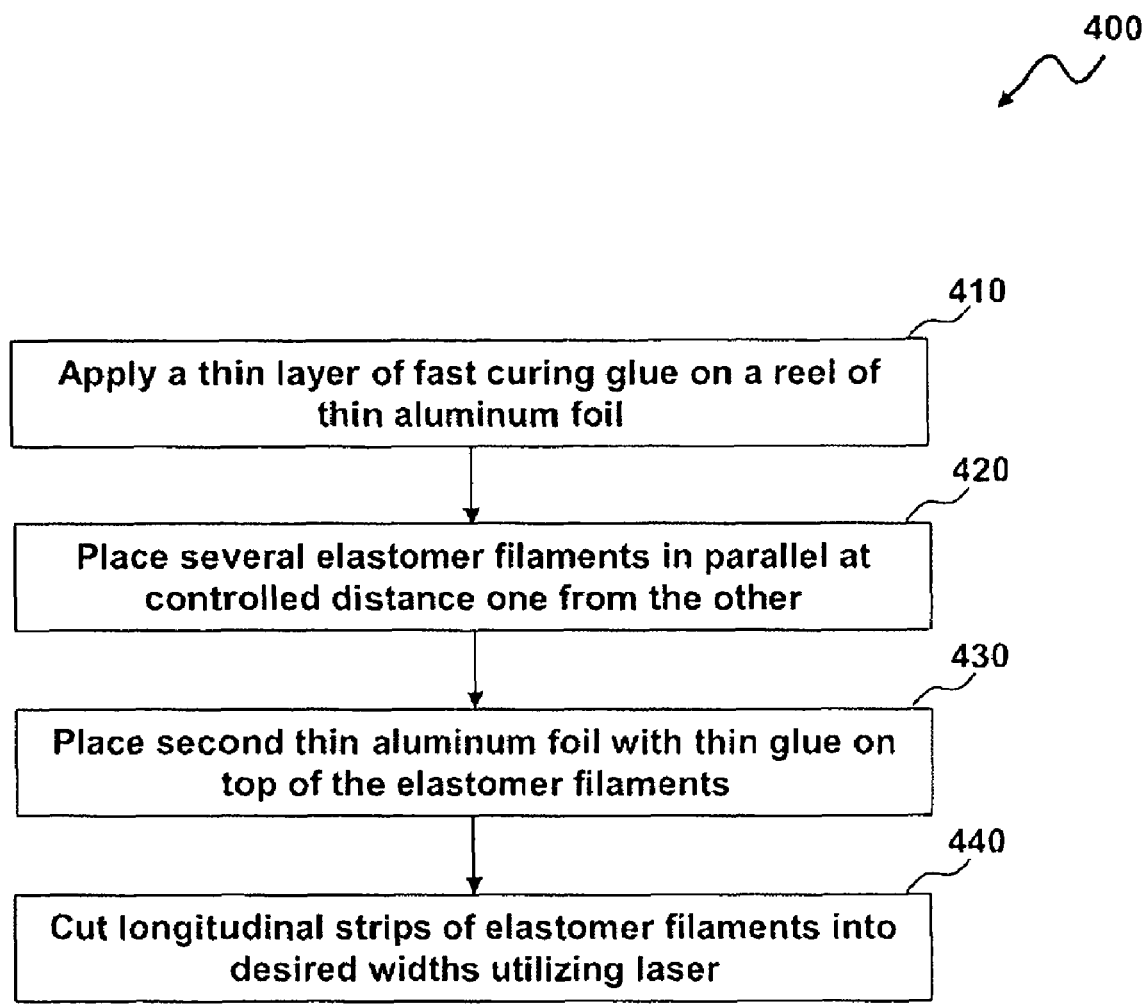
FIG. 4 illustrates a flow chart illustrating logical operation steps of a method for fabricating the patterned dielectric elastomer actuator, which can be implemented in accordance with a preferred embodiment.

The elastomer filaments 120 can touch laterally and the incompressible behavior implies no further squeezing in order to provide a minimal secure distance between the rigid electrodes 110 and 130. The spacing 210 between the elastomer filaments 120 does not change when the filament 120 stretches hence the length of the device does not change. The filaments 120 can be squeezed and can be easily deformed because of free lateral expansion. The dielectric elastomer actuator 100 can be fabricated utilizing reel-to-reel fabrication as illustrated in FIG. 4 with the thin elastomer filaments 120 fabricated ahead of time, by extrusion techniques and cured completely before storing them on reels. The dielectric elastomer actuator 100 may also be utilized as a strain sensor thereby making the device a complete transducer rather than just an actuator. Furthermore, under the combined influence of an axial mechanical input applied along an axial direction and a voltage applied between the pair of electrodes 110 and 130, electrical energy may be harvested from the transducer and as such it may be used as an electric generator.

FIG. 4 illustrates detailed flow chart 400 illustrating logical operation steps of a method for fabricating the patterned dielectric elastomer actuator 100, in accordance with the preferred embodiment. A thin layer of fast curing glue can be applied on a reel of thin aluminum foil 110, as depicted at block 410. A series of thin parallel elastomer filaments 120 can be placed in parallel at controlled distances one from other on the thin aluminum foil 110, as illustrated at block 420. A second thin aluminum foil 130 with fast curing thin glue can be placed on top of the elastomer filaments 120, as shown at block 430. The longitudinal strips of elastomers filaments 120 can be cut into desired widths utilizing a laser beam, as illustrated at block 440.

The long strips of fabricated dielectric elastomers filaments 120 can be either cut transversally or attached to form a stacked device, or folded in order obtain a multilayer stacked device (not shown). The stack along with the aluminum foils 110 and 130 can be sealed in a compliant silicon rubber enclosure (not shown). The voltage difference V can be applied on the two electrical contacts 310 and 320 of the aluminum foils 110 and 130, through which the entire stack compresses and can act as a patterned dielectric elastomer actuator. The patterned dielectric elastomer 100 is very soft at large gaps when electrostatic forces are weak, but very stiff at small gaps when electrostatic forces are strong and may lead to snap-in or electric breakdown. The patterned dielectric elastomer actuator 100 is also compatible with the reel-to-reel fabrication process 400.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A patterned dielectric elastomer actuator, comprising:
   a pair of rigid electrodes;
   a plurality of elastomer filaments placed in parallel at controlled distance one from the other between said pair of rigid electrodes utilizing a thin glue layer in order to form a patterned dielectric elastomer wherein said patterned dielectric elastomer is cut to form a plurality of long strips and attached to form a stacked device; and
   an electrical contact associated with said pair of rigid electrodes wherein said plurality of elastomer filaments compress from a circular cross-section to an elliptical shape, with two neighboring filaments eventually touching in response to a change in an electric field.

2. The patterned dielectric elastomer actuator of claim 1 wherein said pair of rigid electrodes comprises an aluminum thin foil.

3. The patterned dielectric elastomer actuator of claim 1 wherein said pair of rigid electrodes comprises a metallized kapton film.

4. The patterned dielectric elastomer actuator of claim 1 wherein said patterned dielectric elastomer is compatible with a reel-to-reel fabrication process.

5. The patterned dielectric elastomer actuator of claim 1 wherein said patterned dielectric elastomer is included in a generator, and a sensor.

6. The patterned dielectric elastomer actuator of claim 1 wherein said plurality of elastomer filaments and air acts as a patterned dielectric layer.

7. The patterned dielectric elastomer actuator of claim 1 wherein said plurality of elastomer filaments touch laterally and implies no further squeezing which provides a minimal secure distance between said pair of rigid electrodes.

8. A method of making patterned dielectric elastomer actuators, comprising:
    applying a thin layer of fast-curing glue to at least one of a reel of thin aluminum foil and a metalized Kapton film;
    placing elastomer filaments in parallel at controlled distances one from the other on top of the thin layer of fast-curing glue;
    placing a second thin aluminum foil with thin glue layer on top of the filaments; and
    using a laser to cut longitudinal strips of desired widths.

9. The method of making a patterned dielectric elastomer actuator in claim 8, further comprising cutting said longitudinal strips transversally and attaching the strips to form a stacked device.

10. The method of making a patterned dielectric elastomer actuator in claim 8, further comprising cutting said longitudinal strips transversally and folding them in order obtain a multilayer stacked device.

11. The method of making a patterned dielectric elastomer actuator in claim 8, further comprising the step wherein electrical contacts are added to the aluminum foils, and the entire stack is sealed in a compliant silicon rubber enclosure.

12. The method of making a patterned dielectric elastomer actuator in claim 8, wherein upon application of a voltage difference to the two electrical contacts, the entire stack compresses and can be used as an actuator.

13. A method of making patterned dielectric elastomer actuators, comprising:
    forming a sheet by placing elastomer filaments in parallel at controlled distances one from the other on top of at least one of a reel of thin aluminum foil covered with fast-curing glue or a metalized Kapton film covered with fast-curing glue and by placing on top of the filaments a second thin aluminum foil or metalized Kapton film including a thin glue layer thereon;
    cutting longitudinal strips from said sheet; and
    adding electrical contacts to said longitudinal strip cut from said sheet.

14. The method of making a patterned dielectric elastomer actuator in claim 13, further comprising cutting said longitudinal strips transversally and attaching the strips to form a stacked device.

15. The method of making a patterned dielectric elastomer actuator in claim 13, further comprising cutting said longitudinal strips transversally and folding them in order obtain a multilayer stacked device.

16. The method of making a patterned dielectric elastomer actuator in claim 13, wherein the entire sheet is sealed in a compliant silicon rubber enclosure.

17. The method of making a patterned dielectric elastomer actuator in claim 13, wherein upon application of a voltage difference to the two electrical contacts, the longitudinal strip compresses and can therefore be used as an actuator.

* * * * *